United States Patent [19]
Campbell et al.

[11] Patent Number: 6,025,739
[45] Date of Patent: Feb. 15, 2000

[54] CMOS DRIVER CIRCUIT FOR PROVIDING A LOGIC FUNCTION WHILE REDUCING PASS-THROUGH CURRENT

[75] Inventors: John E. Campbell, Wappingers Falls; William T. Devine, Ulster Park, both of N.Y.

[73] Assignee: International Business Machines Corporation, Armonk, N.Y.

[21] Appl. No.: 09/063,065

[22] Filed: Apr. 21, 1998

[51] Int. Cl.[7] .................. H03K 17/16; H03K 19/094; H03K 19/00; H03K 19/096; H03K 19/20

[52] U.S. Cl. ............................. 326/83; 326/83; 326/27; 326/121; 326/93; 326/98; 326/28; 326/119

[58] Field of Search ..................... 326/27, 121, 83, 326/86, 112, 95, 28, 93, 98, 119, 17

[56] References Cited

U.S. PATENT DOCUMENTS

| | | | |
|---|---|---|---|
| 4,760,279 | 7/1988 | Saito et al. | 327/34 |
| 4,818,901 | 4/1989 | Young et al. | 307/451 |
| 4,965,471 | 10/1990 | Gaboury | 307/446 |
| 4,965,474 | 10/1990 | Childers et al. | 307/542 |
| 5,001,369 | 3/1991 | Lee | 307/473 |
| 5,051,625 | 9/1991 | Ikeda et al. | 326/58 |
| 5,059,830 | 10/1991 | Tokumaru et al. | 307/481 |
| 5,097,149 | 3/1992 | Lee | 307/443 |
| 5,111,075 | 5/1992 | Ferry et al. | 307/443 |
| 5,111,076 | 5/1992 | Tarng | 327/27 |
| 5,136,190 | 8/1992 | Chern et al. | 307/475 |
| 5,355,028 | 10/1994 | O'Toole | 307/443 |
| 5,355,029 | 10/1994 | Houghton et al. | 307/443 |
| 5,396,128 | 3/1995 | Dunning et al. | 326/68 |
| 5,491,429 | 2/1996 | Gasparik | 326/27 |
| 5,828,235 | 10/1998 | Horiguchi et al. | 326/121 |

*Primary Examiner*—Michael Tokar
*Assistant Examiner*—James H. Cho
*Attorney, Agent, or Firm*—Ratner & Prestia; Tiffany L. Townsend

[57] ABSTRACT

A CMOS driver circuit minimizes a pass-through current flowing from a first voltage terminal to a second voltage terminal during transitions of an input signal. At least two transistors are connected in series between two voltage terminals. One transistor turns off when the input signal transitions from a low logic state to a high logic state. Another transistor turns off when the input signal transitions high-to-low. During either input signal transition, one of the transistors is off, thereby cutting the path between the voltage terminals to reduce or eliminate the pass-through current. The two transistors are controlled by the output of the circuit through a feedback loop. This feedback loop can include a delay element, one transistor controlled by a single synchronizing clock signal, or two transistors controlled by two complementary clock signals. The driver circuit can be used as a building block to provide conventional combination logic functions. Specific embodiments for an inverter and a NOR gate are described.

20 Claims, 6 Drawing Sheets

CMOS DRIVER CIRCUIT FOR PROVIDING A LOGIC FUNCTION WHILE REDUCING PASS-THROUGH CURRENT

TECHNICAL FIELD

The present invention pertains generally to Complementary Metal Oxide Semiconductor (CMOS) driver circuits, and specifically to CMOS circuits having pass-through currents flowing through those circuits when the input signals change state.

BACKGROUND OF THE INVENTION

CMOS circuits are known for their low power dissipation. Demands for higher performance have resulted, however, in decreasing cycle times and increasing clock frequencies, thereby increasing demand for CMOS driver circuits consuming minimal power.

With the higher operating frequencies demanded by state-of-the-art CMOS microprocessors, a little-known effect of CMOS circuits now accounts for a significant portion of the total overall power dissipation. In some recent designs, the clock distribution circuitry has consumed almost 40% of the total microprocessor chip power.

The effect occurs during a signal transition as the input and output signals of any CMOS static circuit change state. During the transition, a current path is created that runs directly from the $V_{cc}$ positive power supply conductor to ground (GND). Referring to FIG. 1a, this current path is labeled Isc, and current flowing through this path is referred to as "pass-through current." A sample waveform is shown in FIG. 1b. As the input signal changes to produce an output signal change, there exists a period of time when both the upper P-type device(s) $Q_1$ and the lower N-type device(s) $Q_2$ are turned on, thus creating the path from $V_{cc}$ to GND. The resultant current, Isc, is made larger as the input waveform transition time is increased up to a maximum peak value, where further increase in rise time does not produce any further increase in Isc peak value. Nevertheless, the Isc pulse width continues to widen causing the power=$V_{cc}$ * Isc (AVG) to increase further.

Although a simple CMOS inverter is depicted in FIG. 1a, this problem can be found in any CMOS static combinatorial circuit configuration such as a NAND or NOR logical function. There exists a need in the art, therefore, for a CMOS driver circuit that minimizes or eliminates the pass-through current characteristic seen in earlier designs, such as that shown in FIG. 1a. Reducing or eliminating the Isc pass-through current would reduce the power consumed by the circuit, and would also reduce the heat and noise generated by the circuit.

SUMMARY OF THE INVENTION

To meet this an d other needs, and in view of its purposes, the present invention provides a circuit for realizing a logic function while reducing a pass-through current flowing between two voltage terminals during transitions of at least one input signal. One embodiment of the invention realizes a logical inverter function, while another embodiment realizes a logical NOR function. The invention can be used as a building block, however, to implement other classical combinatorial logic functions.

A first embodiment provides an inverter logic function while minimizing pass-though current. A first transistor has a source coupled to the first voltage terminal, a drain, and a gate coupled to receive the input signal. A second transistor has a source coupled to the drain of the first transistor, a drain, and a gate. A third transistor has a source, a drain coupled to the drain of the second transistor, and a gate. The drains of the second and third transistors are coupled to produce an output signal realizing the logic inverter function. A fourth transistor has a drain coupled to the source of the third transistor, a source coupled to the second voltage terminal, and a gate coupled to receive the input signal.

A sampling means receives the output signal at the drains of the second and third transistors and provides the output signal to the gates of the second and third transistors. The second and third transistors are responsive to the sampling means to enter an off-state during transitions of the input signal. Depending on the specific transition of the input signal, whether from high-to-low or from low-to-high, either the second or the third transistor turns off to reduce or eliminate the pass-through current. In this manner, the second and third transistors interrupt the pass-through current flowing between voltage terminals by entering the off-state during transitions of the input signal, thereby reducing the overall pass-through current.

It is to be understood that both the foregoing general description and the following detailed description are exemplary, but are not restrictive, of the invention.

DESCRIPTION OF THE DRAWING

The invention is best understood from the following detailed description when read in connection with the accompanying drawing. Included in the drawing are the following figures:

FIG. 1b is a diagram of a waveform related to the circuit shown in FIG. 1a;

OVERVIEW

Figure 1A:
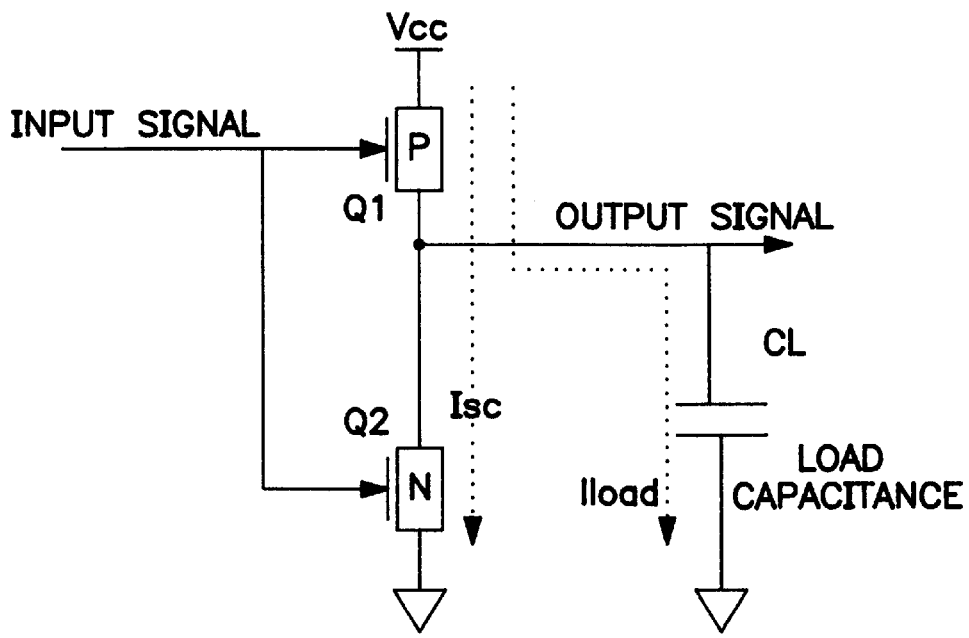
FIG. 1a is a schematic diagram of a conventional CMOS inverter circuit.

According to another aspect of the invention, the second transistor may enter an off-state when the input signal transitions from a logical "high" state to a logical "low" state, an d the third transistor may enter an off-state when the input signal transitions from a logical "low" state to a logical "high" state. Other configurations may be suitable depending on the choice of transistor type, signal thresholds, or other operating parameters.

According to a further aspect of the invention, the sampling means may include a fifth transistor having a source coupled to the drain of the second transistor, and having a drain coupled to the gate of the second transistor. The sampling means may also include a sixth transistor having a source coupled to the drain of the third transistor and having a drain coupled to the gate of the third transistor. The fifth transistor may include a gate being coupled to a first clock signal, and the sixth transistor may include a gate being coupled to a second clock signal. The second clock signal may be the logical complement of the first clock signal. These two clock signals serve to synchronize the sampling and feedback of the output signal. In certain circumstances, it may be possible to implement the sampling means with only one transistor and only one clock signal.

Alternatively, the sampling means may include a delay element having a first terminal coupled to the drains of the second and third transistors, and having a second terminal coupled to the gates of the second and third transistors. Using the delay element eliminates any need for the fifth and sixth transistors.

The circuit may include a reset transistor having a source coupled to the second voltage terminal, having a drain coupled to the gates of the second and third transistors, and having a gate coupled to a reset signal. The reset transistor is responsive to the reset signal to initialize the second and third transistors.

A second exemplary embodiment of a circuit according to the invention provides a NOR logic function between at least two input signals while reducing a pass-through current flowing between two voltage terminals during transitions of the input signals. Each of the input signals may transition between at least two states.

The circuit of the second embodiment may include a first transistor having a source, a drain, and a gate coupled to receive a first one of the input signals. A second transistor has a source coupled to the drain of the first transistor, a drain, and a gate. A third transistor has a source, a drain coupled to the drain of the second transistor, and a gate. The drains of the second and third transistors are coupled to produce an output signal representing the logical NOR of the input signals. A fourth transistor has a source coupled to the second voltage terminal, a drain coupled to the source of the third transistor, and a gate coupled to receive the first input signal.

A sampling means receives an output signal at the drains of the second and third transistors provides the output signal to the gates of the second and third transistors. The second and third transistors are responsive to the sampling means to enter an off-state during transitions of the input signals. Depending on the specific transition of the input signal, whether from high-to-low logic state or from low-to-high logic state, either the second or the third transistor turns off to reduce or eliminate the pass-through current. A fifth transistor has a source coupled to the first voltage terminal, a drain coupled to the source of the first transistor, and a gate coupled to receive the second input signal. A sixth transistor has a source coupled to the second voltage terminal, a drain coupled to the source of the third transistor, and a gate coupled to receive the second input signal. The second and third transistors interrupt the current flowing between two voltage terminals by entering the off-state during transitions of the two input signals, thereby reducing the pass-through current flowing through the circuit.

The sampling means may include a seventh transistor having a source coupled to the drain of the second transistor and a drain coupled to the gate of the second transistor. The seventh transistor may include a gate, which is coupled to receive a first clock signal. The sampling means may include an eighth transistor having a source coupled to the drain of said third transistor, and a drain coupled to the gate of the third transistor. The eighth transistor may include a gate that is coupled to a second clock signal. These two clock signals serve to synchronize the sampling and feed back of the output signal to the gates of the second and third transistors. In certain circumstances, it may be possible to implement the sampling means with only one transistor and only one clock signal.

Alternatively, the sampling means may include a delay element having a first terminal coupled to the drains of the second and third transistors, and a second terminal coupled to the gates of the second and third transistors. Using the delay element eliminates any need for the synchronizing clock signals.

DETAILED DESCRIPTION OF THE INVENTION

Figure 2:
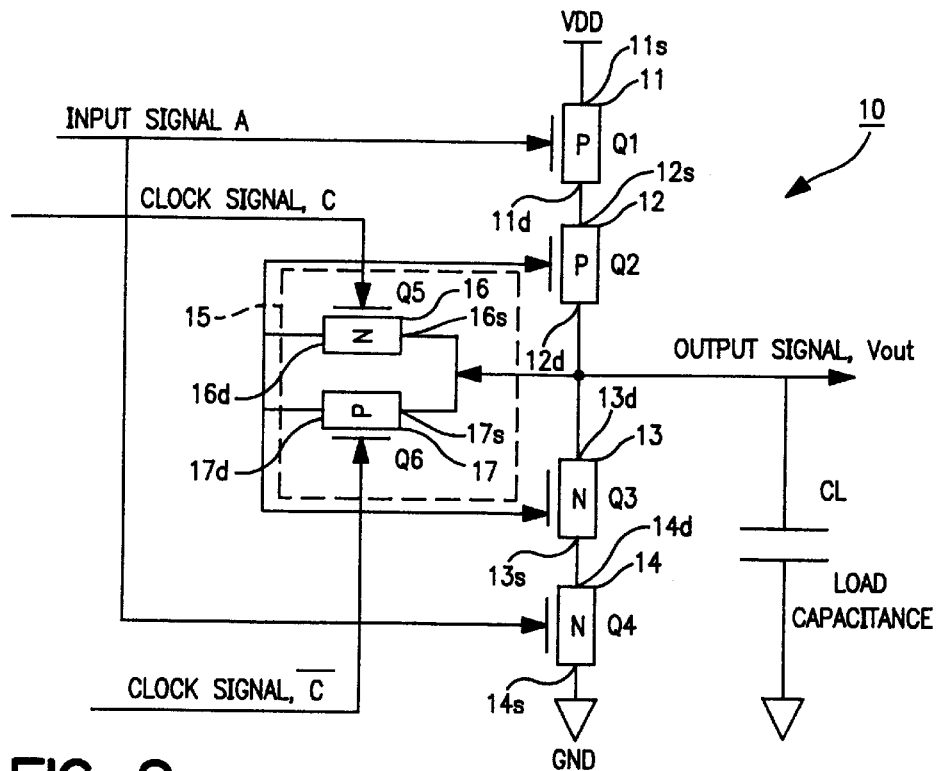
FIG. 2 is a schematic diagram of a circuit providing a logical inversion function.
Figure 7:
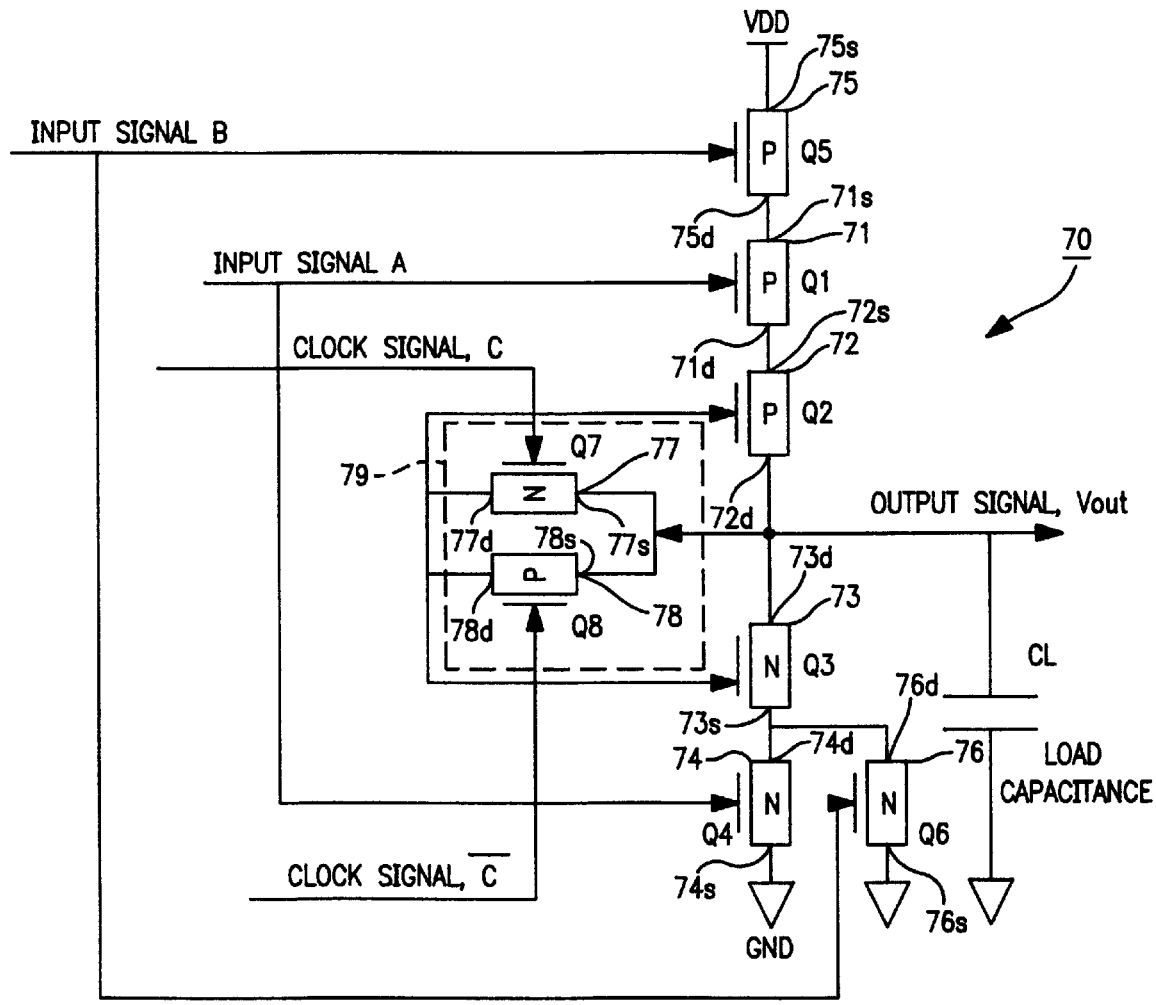
FIG. 7 is a schematic diagram of a circuit for providing a logical NOR function.

FIG. 2 is a schematic diagram of an exemplary embodiment of the invention, driver circuit 10. Driver circuit 10 provides a selected logic function while reducing a pass-through current flowing between a first voltage terminal VDD and a second voltage terminal GND during transitions of at least one input signal A. This input signal A transitions between at least two states, preferably a state corresponding to a logical low and a state corresponding to a logical high. The circuit of FIG. 2 provides the logical inversion function, although the same current reduction principles are applicable to provide other conventional combinatorial logic functions. For example, FIG. 7 illustrates a circuit providing a NOR logical function.

Driver circuit 10 may include at least four transistors 11, 12, 13, and 14 and a sampling means 15. The transistor 11 has a source 11s coupled to the voltage terminal VDD, a drain 11d, and a gate coupled to receive the input signal A. The transistor 12 has a source 12s coupled to the drain 11d of the first transistor 11, and has a drain 12d and a gate. The transistor 13 has a source 13s, a drain 13d coupled to the drain 12d of the transistor 12, and a gate. The drains 12d and 13d of the transistors 12 and 13 are coupled to produce an output signal $V_{out}$ achieving the logic function, in this case logical inversion. The transistor 14 has a drain 14d coupled to the source 13s of the transistor 13, a source 14s coupled to the voltage terminal GND, and a gate coupled to receive the input signal A. Load capacitance CL is coupled between the output terminal $V_{out}$ and the voltage terminal GND.

Driver circuit 10 may be configured so that the transistor 12 enters an off-state when the input signal A transitions from a first state to a second state, while the transistor 13 enters an off-state when the input signal A transitions from the second state to the first state. More specifically, driver circuit 10 may be configured so that the transistor 12 enters an off-state when the input signal A transitions from a negative (logical low) state to a positive (logical high) state, and so that the transistor 13 enters an off-state when the input signal A transitions from a positive state to a negative state.

Driver circuit 10 also includes means 15 for sampling the output signal $V_{out}$ at the drains of the transistors 12 and 13 and providing that output signal back to the gates of the same transistors 12 and 13. The transistors 12 and 13 are responsive to the sampling means 15 to enter off-states during transitions of the input signal A. In this manner, the transistors 12 and 13 interrupt the pass-through current flowing between the voltage terminal VDD and the voltage terminal GND by entering off-states during transitions of the input signal A, thereby interrupting the current path from VDD to GND and reducing the pass-through current flowing through driver circuit 10.

The sampling means 15 may include a transistor 16 having a source 16s coupled to the drain 12d of the transistor 12, and having a drain 16d coupled to the gate of the transistor 12. Also, the sampling means 15 may include a transistor 17 having a source 17s coupled to the drain 13d of the transistor 13 and having a drain 17d coupled to the gate of the transistor 13.

The transistor 16 includes a gate coupled to receive a first clock signal C, and the transistor 17 includes a gate being coupled to a second clock signal C'. The second clock signal C' is preferably the logical inversion of the first clock signal C. Clock signals C and C' synchronize the sampling and feedback of $V_{out}$ to transistors 12 and 13. The specific timing of this operation is described below in connection with FIG. 3.

In certain circumstances, it may be possible to implement sampling means 15 with only one transistor and only one clock signal. The exemplary embodiment uses two transistors and two complementary clock signals. One reason for using two transistors is to avoid any problem with sampling a logical-high output signal and using that voltage to turn transistor 12 off. If clock signal C is not sufficiently high to turn transistor 16 on, then the full voltage at $V_{out}$ may not be conducted through transistor 16 to the gates of transistors 12 and 13. As a result, transistor may not be turned fully off, resulting in a possible current path between VDD and GND through transistor 12. Such a current path would undermine the current-reducing effectiveness of circuit 10.

As a type of back-up, transistor 17 and complementary clock signal C' are added to ensure that $V_{out}$, when high, is conducted to the gates of transistor 12 to turn it completely off. If the voltage of the clock signal C is sufficiently "high" while in its logical-high state with respect to VDD, however, or if the threshold voltage of transistor 12 is chosen so that a clock signal C having voltage approximately equal to VDD turns it off, then transistor 17 and complementary clock signal C' can be eliminated.

To eliminate transistor 17, one may provide another power supply voltage, or use ion-implantation techniques to adjust the threshold voltage of transistor 12. Depending on the circumstances of a given application, one or both of these approaches may be suitable.

In the circuit of FIG. 2, the transistors 13, 14, and 16 are preferably n-channel transistors, while the transistors 11, 12, and 17 are preferably p-channel transistors.

Figure 3:
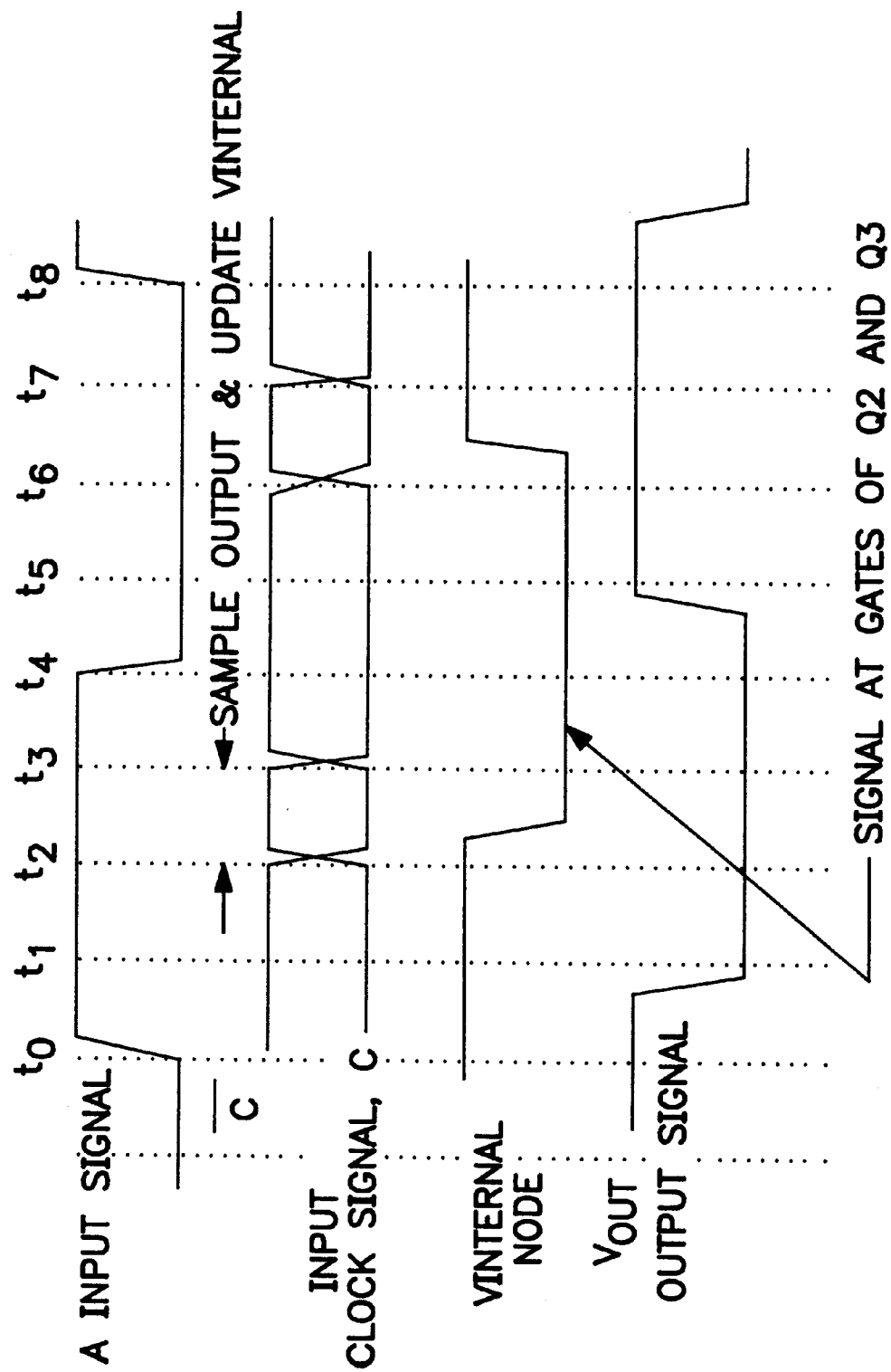
FIG. 3 is a timing diagram illustrating the operation of an exemplary embodiment.

FIG. 3 is a timing diagram illustrating the operation of the preferred embodiment driver circuit 20 shown in FIG. 2. FIG. 3 illustrates first a low-to-high transition of input signal A, and then illustrates a high-to-low transition of A.

In the initial state of the circuit, before $t_0$, input signal A is logic low, while output signal $V_{out}$ is logic high. Before $t_0$, with input signal in a "low" state, transistor 11 is on, conducting VDD to the source of transistor 12. Also, transistor 14 is off, cutting the path from VDD to GND. Before $t_0$, $V_{out}$ is in a logic "high" state, and this signal is passed to the sources 16s and 17s of transistors 16 and 17. However, with clock signals C and C' being low and high, respectively, transistors 16 and 17 are off, and $V_{out}$ is not yet fed back to the gates of transistors 12 and 13.

At $t_0$, input signal A begins to transition to a "high" state, which causes transistor 11 to become progressively more non-conductive and causes transistor 14 to become progressively more conductive, thus conducting GND to the source 13s of transistor 13. Assuming transistor 13 has been initialized to a conductive state, then transistors 13 and 14 both conduct current. The voltage at voltage terminal GND is conducted to $V_{out}$, thus draining current from load capacitance CL and driving $V_{out}$ low.

At $t_1$, output signal $V_{out}$ is fully in its "low" state, while input signal A is fully in its "high" state.

At $t_2$, external clock signals C and C' activate sampling means 15 to sample $V_{out}$ at the drains 12d and 13d of the transistors 12 and 13 and feed back that signal to the gates of those same transistors 12 and 13. When clock signal C transitions high, transistor 16 becomes more conductive. When complementary clock signal C' goes low, transistor 17 becomes more conductive. The exact timing of the activation of C and C' is not critical. The main requirement is that the clock signals C and C' be activated after $V_{out}$ has fully transitioned in response to the input signal A. This sequence is graphically illustrated in FIG. 3 by the time interval elapsing between $t_1$ and $t_2$.

Figure 1B:
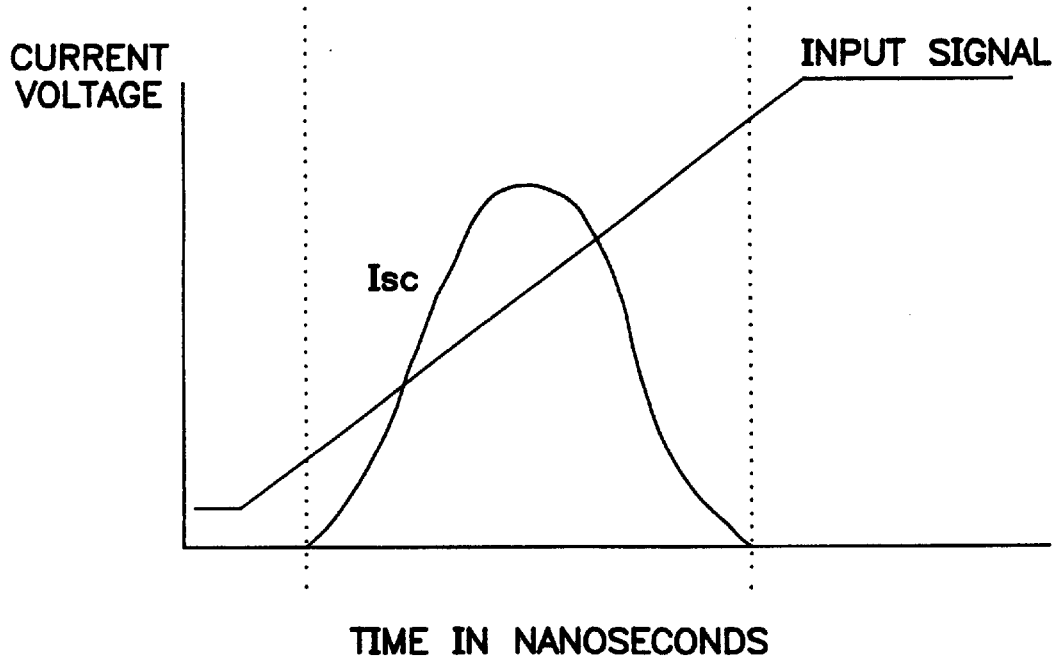

Shortly after $t_2$, clock signals C and C' have fully transitioned to their active states, and transistors 16 and 17 are turned on. At this point, the logical "low" value of $V_{out}$ is sampled and fed back to the gates of transistors 12 and 13. Thus, this "low" signal from $V_{out}$ turns transistor 13 off, and turns transistor 12 on. With transistor 12 on, the circuit is ready for the next high-to-low transition of input signal A. In that case, as soon as transistor 11 turns on, VDD is conducted to output terminal $V_{out}$. When transistor 13 turns off, the current path from VDD to GND is blocked, thus reducing or eliminating the Isc pass-through current characteristic described above in connection with FIG. 1. Thus, the signal $V_{internal}$ shown in FIG. 3 is a delayed version of $V_{out}$.

From $t_2$ to $t_3$, clock signals C and C' are active, sampling $V_{out}$ and updating $V_{internal}$. After $t_3$, clock signals C and C' are deactivated in preparation for the next high-to-low transition of input signal A.

At $t_4$, input signal A begins a high-to-low transition, and completes this transition by $t_5$. As input signal A goes "low", transistor 11 is turned on, and transistor 14 is turned off. However, during the transition of input signal A, little or no pass-through current flows from VDD to GND because transistor 13 was already turned off. As transistor 11 turns on, current flows through transistors 11 and 12 to charge output capacitance CL and drive $V_{out}$ high.

At $t_5$, $V_{out}$ has fully transitioned high in response to input signal A.

At $t_6$, clock signals C and C' are again activated to sample $V_{out}$ and feed it back to the gates of transistors 12 and 13. This time, $V_{out}$ is high and when it is fed back to transistors 12 and 13, transistor 12 is turned off and transistor 13 is turned on. Turning transistor 12 off reduces or eliminates the Isc pass-through current during the next low-to-high transition of input signal A. Turning transistor 13 on readies the circuit to discharge load capacitance CL in response to the next low-to-high transition of input signal A. The interval from $t_5$ to $t_6$ denotes the required delay between transition of $V_{out}$ and the activation of C and C'. Between $t_6$ and $t_7$, $V_{internal}$ goes high, echoing $V_{out}$.

At $t_7$, clock signals C and C' are deactivated in preparation for the next low-to-high transition of input signal A.

At $t_8$, the next low-to-high transition of input signal A begins, just as at $t_0$ discussed above.

Figure 4:
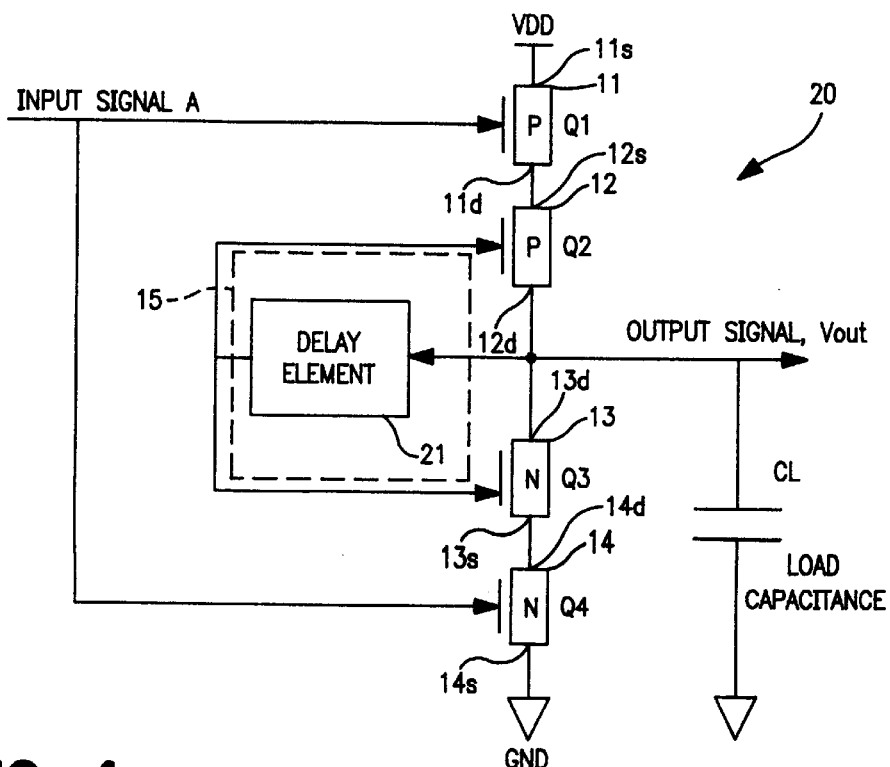
FIG. 4 is a schematic diagram of the circuit shown in FIG. 2, but substituting a delay element for certain transistors.

In FIG. 4, the sampling means 15 of driver circuit 20 may include a simple delay element 21 having a first terminal coupled to the drains 12d and 13d of the transistors 12 and 13, and having a second terminal coupled to the gates of the transistors 12 and 13. Driver circuit 20 does not employ a clock signal C or C'. Instead, delay element 21 is chosen to sample $V_{out}$ and feed it back to the gates of transistors 12 and 13 after output signal $V_{out}$ has transitioned completely in response to input signal A. In all other respects, driver circuit 20 is similar to driver circuit 10 shown in FIG. 2. Items in FIG. 4 having the same reference numerals as items shown in FIG. 2 are the same as described above with reference to FIG. 2, and a description thereof is not repeated.

Figure 5:
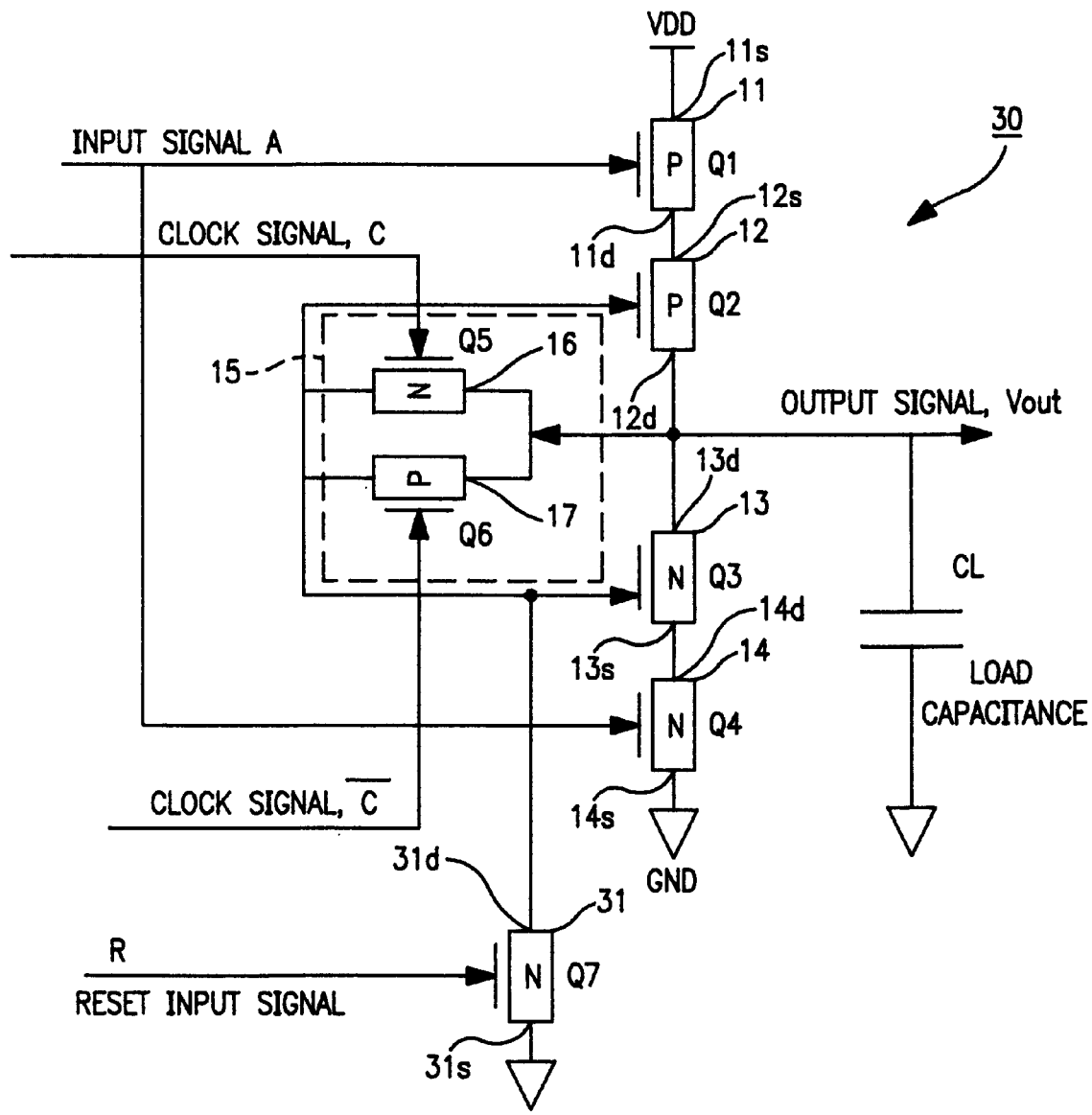
FIG. 5 is a schematic diagram of the circuit shown in FIG. 2, with a reset transistor added.

In FIG. 5, driver circuit 30 may include a reset transistor 31 having a source 31s coupled to the voltage terminal GND, having a drain 31d coupled to the gates of transistors 12 and 13, and having a gate coupled to an external reset signal R. In this manner, the reset transistor 31 is responsive to the reset signal R to initialize the transistors 12 and 13. As shown, when an active-high reset signal R is applied to the gate of reset transistor 31, reset transistor 31 conducts the voltage at voltage terminal GND to the gates of transistors 12 and 13. Thus, transistor 12 is reset to a conductive state, and transistor 13 is reset to a non-conductive state.

Figure 6:
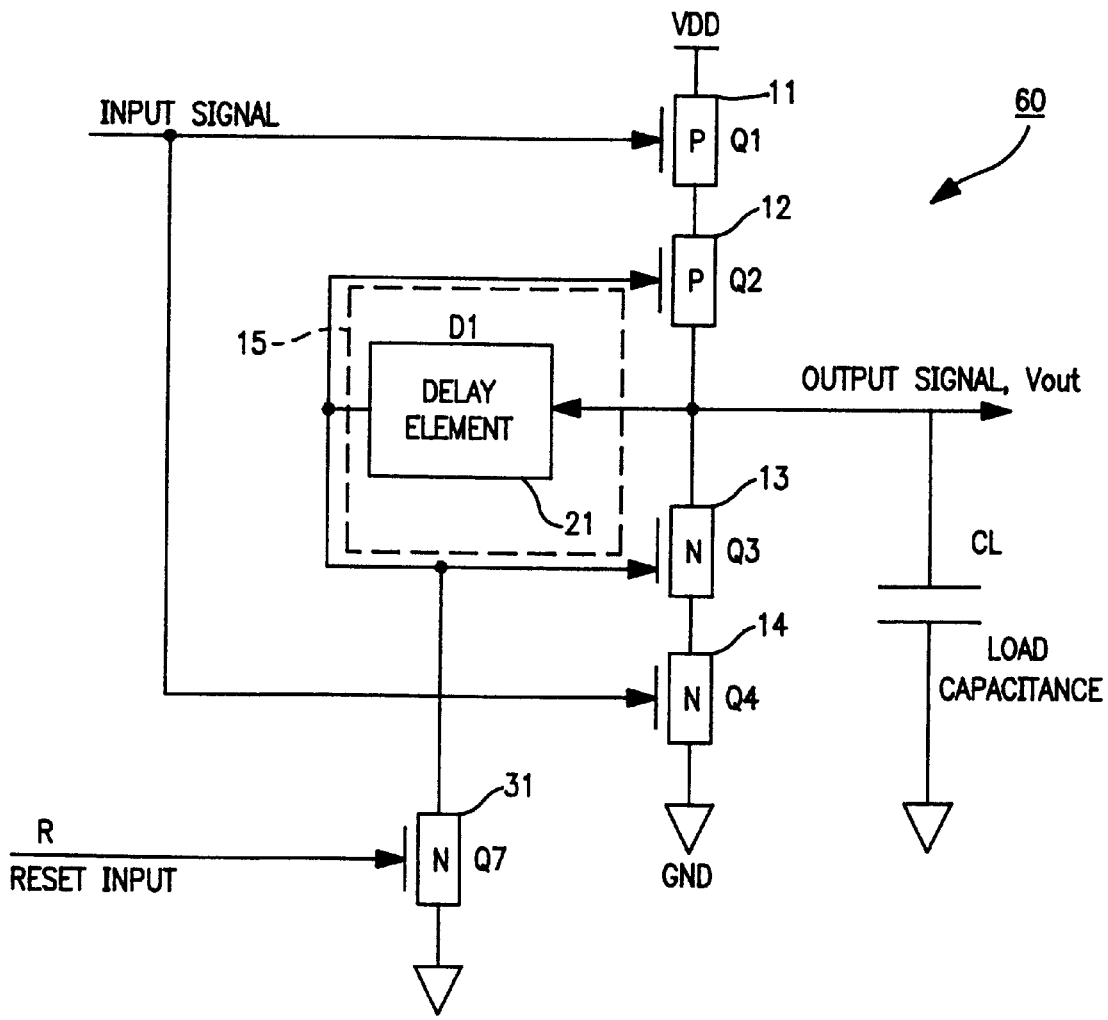
FIG. 6 is a schematic diagram of the circuit shown in FIG. 4, with a reset transistor added.

In FIG. 6, driver circuit 60 combines reset transistor 31 (shown above in FIG. 5) with delay element 21 (shown above in FIG. 4). In all other respects, driver circuit 60 functions similarly to driver circuit 20 shown in FIG. 3, and identical components are indicated by the same reference numerals used in FIG. 3.

FIG. 7 illustrates a circuit 70 for providing a NOR logic function between at least two input signals A and B, while reducing a pass-through current flowing between a voltage terminal VDD and a voltage terminal GND during transitions of the input signals A and B. Each of the input signals A and B transitions between at least two states. A first transistor 71 has a source 71s, a drain 71d, and a gate coupled to receive the input signal A. A transistor 72 has a source 72s coupled to the drain 71d of the transistor 71, a drain 72d, and a gate. A transistor 73 has a source 73s, a drain 73d coupled to the drain 72d of the transistor 72, and a gate. The drains 72d and 73d of the transistors 72 and 73 are coupled to produce an output signal $V_{out}$ representing the logical NOR of the input signals A and B. The transistor 74 has a source 74s coupled to the voltage terminal GND, a drain 74d coupled to the source 73s of the transistor 73, and a gate coupled to receive the first input signal A. Load capacitance CL is coupled between the output terminal $V_{out}$ and the voltage terminal GND.

A transistor 75 has a source 75s coupled to the voltage terminal VDD, a drain 75d coupled to the source 71s of the transistor 71, and a gate coupled to receive the input signal B. A transistor 76 has a source 76s coupled to the voltage terminal GND, a drain 76d coupled to the source 73s of the transistor 73 and a gate coupled to receive the input signal B.

The transistors 72 and 73 interrupt the current flowing between the voltage terminal VDD and the voltage terminal GND by entering the off-state (non-conductive) during transitions of the two input signals A and B, thereby reducing the pass-through current flowing through the circuit 70.

The circuit 70 illustrated in FIG. 7 also includes means 79 for sampling the output signal $V_{out}$ at the drains 72d and 73d of the transistors 72 and 73, and providing $V_{out}$ to the gates of the same transistors 72 and 73. The transistors 72 and 73 are responsive to the sampling means 79 to enter an off-state during transitions of the input signals A and B. When transistors 72 and 73 enter the off state, the current path between VDD and GND is cut, thus reducing the passing current.

The sampling means 79 may include a transistor 77 having a source 77s coupled to the drain 72d of the transistor 72 and having a drain 77d coupled to the gate of the transistor 72. The transistor 77 may include a gate coupled to a clock signal C. The sampling means 79 may also include a transistor 78 having a source 78s coupled to the drain 73d of the transistor 73 and having a drain 78d coupled to the gate of the transistor 73. The transistor 78 may include a gate being coupled to a clock signal C'. The clock signal C' is the logical complement of the clock signal C. Clock signals C and C' synchronize the sampling and feedback of $V_{out}$ to the gates of transistors 72 and 73. The same considerations discussed above relating to the timing diagram shown in FIG. 2 apply here as well.

Alternatively, the sampling means 79 may include a delay element, such as that shown in FIG. 4, having a terminal coupled to the drains of the transistors 72 and 73, and having a terminal coupled to the gates of the transistors 72 and 73. As before, using a delay element eliminates any need for transistors 77 and 73 and clock signal C and C'.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A circuit for providing a logic function while reducing a pass-through current flowing between a first voltage terminal and a second voltage terminal during transitions of at least one input signal, the input signal transitioning between at least two states, said circuit comprising:

(a) a first transistor having a source coupled to the first voltage terminal, the first transistor having a drain and a gate receiving the input signal;

(b) a second transistor having a source coupled to the drain of said first transistor, the second transistor having a drain and a gate;

(c) a third transistor having a source, a drain coupled to the drain of said second transistor, and a gate, the drains of said second and third transistors being coupled to produce an output signal providing the logic function;

(d) a fourth transistor having a drain coupled to the source of said third transistor, the fourth transistor having a source coupled to the second voltage terminal and a gate receiving the input signal; and (e) means for sampling the output signal at the drains of said second and third transistors and providing the output signal to the gates of said second and third transistors, said second and third transistors being responsive to said sampling means to enter an off-state during transitions of the input signal, wherein said second and third transistors interrupt the current flowing between the first voltage terminal and the second voltage terminal by entering the off-state during transitions of the input signal, thereby reducing the pass-through current.

2. The circuit of claim 1, wherein said second transistor is responsive to said sampling means to enter an off-state when the input signal transitions from a first state to a second state, and wherein said third transistor is responsive to said sampling means to enter an off-state when the input signal transitions from the second state to the first state.

3. The circuit of claim 1, wherein said second transistor enters an off-state when the input signal transitions from a negative state to a positive state, and wherein said third transistor enters an off-state when the input signal transitions from a positive state to a negative state.

4. The circuit of claim 1, wherein said sampling means includes a fifth transistor having a source coupled to the drain of the second transistor and having a drain coupled to the gate of the second transistor.

5. The circuit of claim 4, wherein said sampling means includes a sixth transistor having a source coupled to the drain of said third transistor and a drain coupled to the gate of the third transistor.

6. The circuit of claim 5 further comprising a first clock signal and a second clock signal, said fifth transistor having a gate receiving the first clock signal and said sixth transistor having a gate receiving the second clock signal.

7. The circuit of claim 5, wherein said fifth transistor is an n-channel transistor, and said sixth transistor is a p-channel transistor.

8. The circuit of claim 1, wherein said sampling means includes a delay element having a first terminal coupled to the drains of said second and third transistors and having a second terminal coupled to the gates of said second and third transistors.

9. The circuit of claim 1, wherein said first and second transistors are p-channel transistors.

10. The circuit of claim 1, wherein said third and fourth transistors are n-channel transistors.

11. The circuit of claim 1, further comprising a reset transistor having a source coupled to the second voltage terminal, a drain coupled to the gates of said second and third transistors, and a gate coupled to a reset signal, whereby said reset transistor is responsive to the reset signal to initialize said second and third transistors.

12. A circuit for providing a NOR logic function between at least two input signals while reducing a pass-through current flowing between a first voltage terminal and a second voltage terminal during transitions of the input signals, the input signals each transitioning between at least two states, said circuit comprising:

(a) a first transistor having a source, a drain, and a gate receiving a first one of the input signals;

(b) a second transistor having a source coupled to the drain of said first transistor, the second transistor having a drain and a gate, (c) a third transistor having a source, a drain coupled to the drain of said second transistor, and a gate, the drains of said second and third transistors being coupled to produce an output signal representing the logical NOR cf the input signals;

(d) a fourth transistor having a source coupled to the second voltage terminal, a drain coupled to the source of said third transistor, and a gate receiving the first input signal;

(e) means for sampling an output signal at the drains of said second and third transistors and providing the output signal to the gates of said second and third transistors, said second and third transistors being responsive to said sampling means to enter an off-state during transitions of the input signals;

(f) a fifth transistor having a source coupled to the first voltage terminal, a drain coupled to the source of said first transistor, and a gate receiving the second input signal; and (g) a sixth transistor having a source coupled to the second voltage terminal, a drain coupled to the source of said third transistor, and a gate receiving the second input signal, wherein said second and third transistors interrupt the current flowing between the first voltage terminal and the second voltage terminal by entering the off-state during transitions of the two input signals, thereby reducing the pass-through current.

13. The circuit of claim 12, wherein said sampling means include a seventh transistor having a source coupled to the drain of the second transistor and a drain coupled to the gate of the second transistor.

14. The circuit of claim 13 further comprising a first clock signal, said seventh transistor having a gate receiving the first clock signal.

15. The circuit of claim 13, further comprising an eighth transistor having a source coupled to the drain of said third transistor and a drain coupled to the gate of the third transistor.

16. The circuit of claim 15 further comprising a second clock signal, said eighth transistor having a gate receiving the second clock signal.

17. The circuit of claim 12, wherein said sampling means includes a delay element having a first terminal coupled to the drains of said second and third transistors, and having a second terminal coupled to the gates of said second and third transistors.

18. A circuit for providing an inverter logic function for at least one input signal while reducing a pass-through current flowing between a first voltage terminal and a second voltage terminal during transitions of the input signal, the input signal transitioning between at least two states, said circuit comprising:

(a) a first transistor having a source coupled to the first voltage terminal, a drain, and a gate receiving the input signal;

(b) a second transistor having a drain, a source coupled to the drain of said first transistor, and a gate;

(c) a third transistor having a source, a drain coupled to the drain of said second transistor, and a gate, the drains of said second and third transistors being coupled to produce an output signal realizing the logical inversion of the input signal;

(d) a fourth transistor having a source coupled to the second conductor, a drain coupled to the source of said third transistor, and a gate receiving the input signal;

(e) means for sampling the signal at the drains of said second and third transistors and feeding back that signal to the gates of said second and third transistors, wherein said second and third transistors interrupt the current flowing between the first voltage terminal and the second voltage terminal by entering an off-state during transitions of the input signal, thereby reducing the pass-through current.

19. The circuit of claim 18 further comprising a first clock signal, said sampling means including a fifth transistor having a source coupled to the drains of said second and third transistors, a drain coupled to the gates of said second and third transistors, and a gate coupled to the first clock signal.

20. The circuit of claim 19 further comprising a second clock signal, said sampling means including a sixth transistor having a source coupled to the drains of said second and third transistors, a drain coupled to the gates of said second and third transistors, and a gate coupled to the second clock signal, the second clock signal being the logical complement of the first clock signal.

* * * * *